(12) United States Patent
Liu et al.

(10) Patent No.: US 9,613,919 B2
(45) Date of Patent: Apr. 4, 2017

(54) CHIP PACKAGE AND METHOD FOR FORMING THE SAME

(71) Applicant: XINTEC INC., Taoyuan (TW)

(72) Inventors: Tsang-Yu Liu, Zhubei (TW); Po-Han Lee, Taipei (TW); Wei-Ming Chien, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/958,672

(22) Filed: Dec. 3, 2015

(65) Prior Publication Data

US 2016/0181212 A1 Jun. 23, 2016

(30) Foreign Application Priority Data

Dec. 17, 2014 (TW) .............................. 103144009 A (51) Int. Cl.
*H01L 23/00* (2006.01)
*B81C 3/00* (2006.01)
*H01L 23/31* (2006.01)

(52) U.S. Cl.
CPC ................ *H01L 24/02* (2013.01); *B81C 3/00* (2013.01); *H01L 23/315* (2013.01); *H01L 24/05* (2013.01); *H01L 24/32* (2013.01); *H01L 24/73* (2013.01); *H01L 24/92* (2013.01); *H01L 24/11* (2013.01); *H01L 24/13* (2013.01); *H01L 24/29* (2013.01); *H01L 24/83* (2013.01); *H01L 24/94* (2013.01); *H01L 24/95* (2013.01); *H01L 2224/024* (2013.01); *H01L 2224/0233* (2013.01); *H01L 2224/0239* (2013.01); *H01L 2224/02313* (2013.01); *H01L 2224/02351* (2013.01); *H01L 2224/02371* (2013.01); *H01L 2224/02377* (2013.01); *H01L 2224/02381* (2013.01); *H01L 2224/0401* (2013.01); *H01L 2224/04026* (2013.01); *H01L 2224/05009* (2013.01); *H01L 2224/0569* (2013.01); *H01L 2224/05548* (2013.01); *H01L 2224/05572* (2013.01); *H01L 2224/05611* (2013.01); *H01L 2224/05624* (2013.01); *H01L 2224/05644* (2013.01);

(Continued)

(58) Field of Classification Search
CPC ......... H01L 21/76898; H01L 21/76879; H01L 23/481; H01L 23/49827; H01L 25/0657; H01L 24/02
See application file for complete search history.

(56) References Cited

U.S. PATENT DOCUMENTS

2009/0166840 A1* 7/2009 Kang ................ H01L 21/76898
257/686
2011/0193241 A1 8/2011 Yen et al.
2011/0278735 A1* 11/2011 Yen .......................... B81B 7/007
257/774

FOREIGN PATENT DOCUMENTS

TW 201234557 8/2012

* cited by examiner

*Primary Examiner* — Tucker J Wright
(74) *Attorney, Agent, or Firm* — Liu & Liu (57) ABSTRACT

A chip package is provided. The chip package includes a substrate having a first surface and a second surface opposite thereto. A dielectric layer is disposed on the first surface of the substrate and includes a conducting pad structure. A first opening penetrates the substrate and exposes a surface of the conducting pad structure. A second opening is communication with the first opening and penetrates the conducting pad structure. A redistribution layer is conformally disposed on a sidewall of the first opening and the surface of the conducting pad structure and is filled into the second opening. A method for forming the chip package is also provided.

20 Claims, 4 Drawing Sheets

(52) U.S. Cl.
CPC ........... *H01L 2224/05647* (2013.01); *H01L 2224/05655* (2013.01); *H01L 2224/05669* (2013.01); *H01L 2224/05687* (2013.01); *H01L 2224/1132* (2013.01); *H01L 2224/1146* (2013.01); *H01L 2224/11849* (2013.01); *H01L 2224/131* (2013.01); *H01L 2224/13024* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/29011* (2013.01); *H01L 2224/2919* (2013.01); *H01L 2224/29082* (2013.01); *H01L 2224/29186* (2013.01); *H01L 2224/32013* (2013.01); *H01L 2224/32225* (2013.01); *H01L 2224/73253* (2013.01); *H01L 2224/92242* (2013.01); *H01L 2224/94* (2013.01); *H01L 2224/95* (2013.01); *H01L 2924/12041* (2013.01); *H01L 2924/141* (2013.01); *H01L 2924/143* (2013.01); *H01L 2924/1461* (2013.01)

CHIP PACKAGE AND METHOD FOR FORMING THE SAME

CROSS REFERENCE TO RELATED APPLICATIONS

This Application is based on, and claims priority of Taiwan Patent Application No. 103144009, filed on Dec. 17, 2014, the entirety of which is incorporated by reference herein.

BACKGROUND OF THE INVENTION

Field of the Invention

The invention relates to chip package technology, and in particular to a chip package and methods for forming the same.

Description of the Related Art

The chip packaging process is an important step in the fabrication of electronic products. Chip packages not only protect the chips therein from outer environmental contaminants, but they also provide electrical connection paths between the electronic elements inside and those outside of the chip packages.

In conventional chip packages, a conducting layer is in contact with a surface of a signal contact pad so as to form an electrical connection path to those outside of the chip packages.

However, conductance between the signal contact pad and the conducting layer is poor. Also, structural strength is insufficient. As a result, the quality of such chip packages is negatively affected.

Thus, there exists a need in the art for development of a chip package and methods for forming the same capable of mitigating or eliminating the aforementioned problems.

BRIEF SUMMARY OF THE INVENTION

An embodiment of the invention provides a chip package. The chip package comprises a substrate having a first surface and a second surface opposite thereto. A dielectric layer is disposed on the first surface of the substrate and comprises a conducting pad structure. A first opening penetrates the substrate and exposes a surface of the conducting pad structure. A second opening communicates with the first opening and penetrates the conducting pad structure. A redistribution layer is conformally disposed on a sidewall of the first opening and the surface of the conducting pad structure and is filled into the second opening.

An embodiment of the invention provides a method for forming a chip package. The method comprises providing a substrate having a first surface and a second surface opposite thereto. A dielectric layer is disposed on the first surface of the substrate, and comprises a conducting pad structure. The method also comprises forming a first opening penetrating the substrate and exposing a surface of the conducting pad structure. The method further comprises forming a second opening in communication with the first opening and penetrating the conducting pad structure. In addition, the method comprises forming a redistribution layer conformally on a sidewall of the first opening and the surface of the conducting pad structure and filling into the second opening.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits or to form a system-in-package (SIP).

Figure 1A:
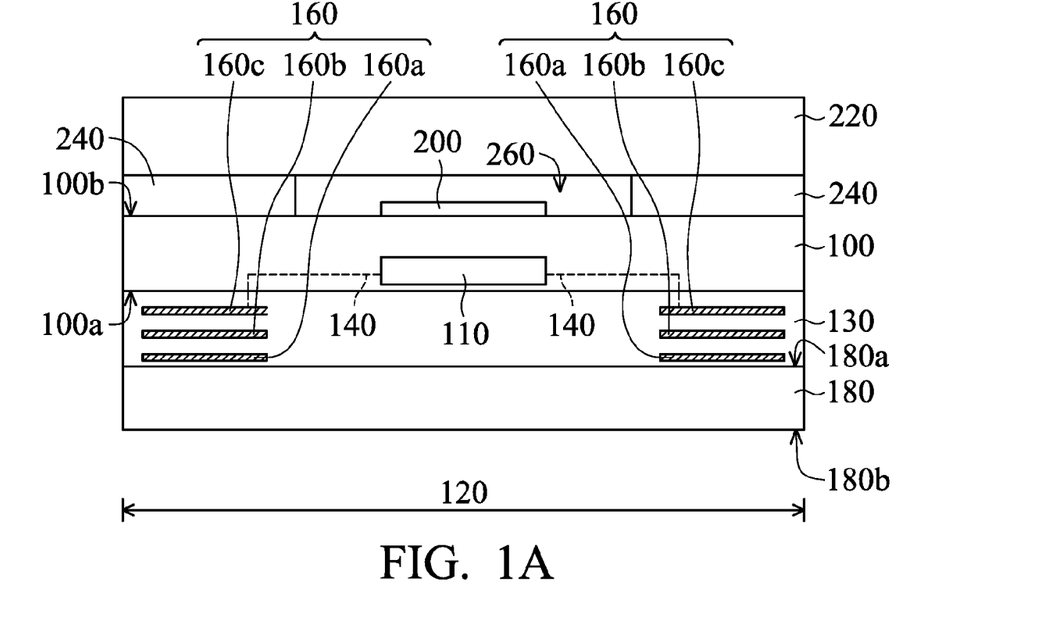
FIGS. 1A to 1E are cross-sectional views of an exemplary embodiment of a method for forming a chip package according to the invention.
Figure 1B:
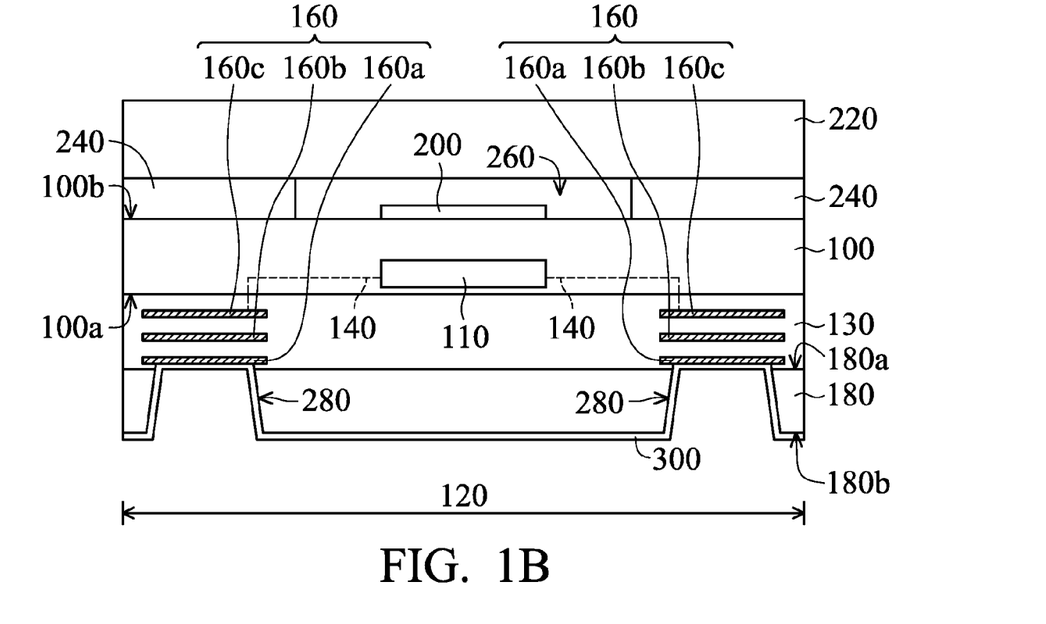
Figure 1C:
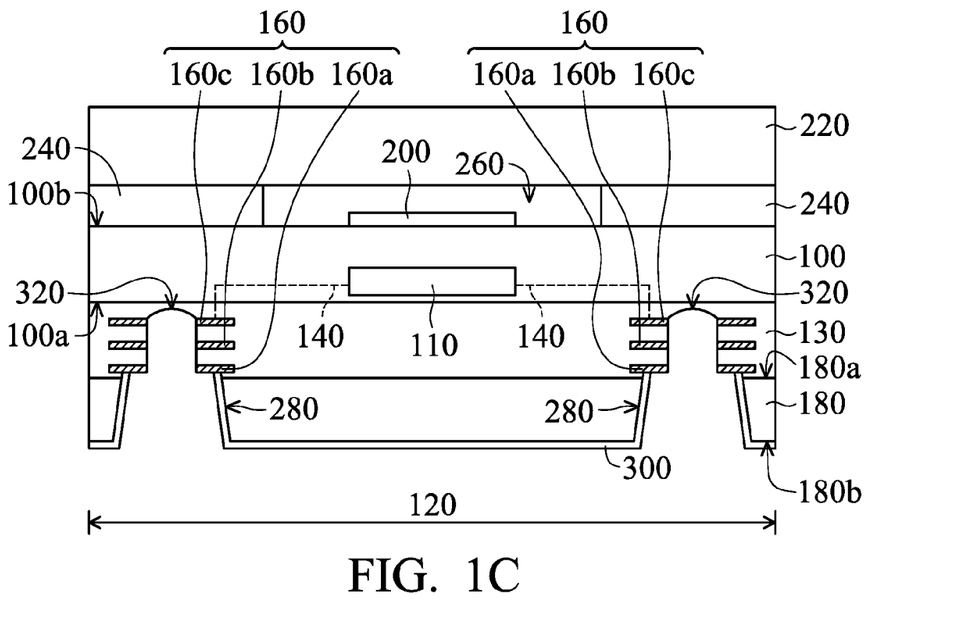
Figure 1D:
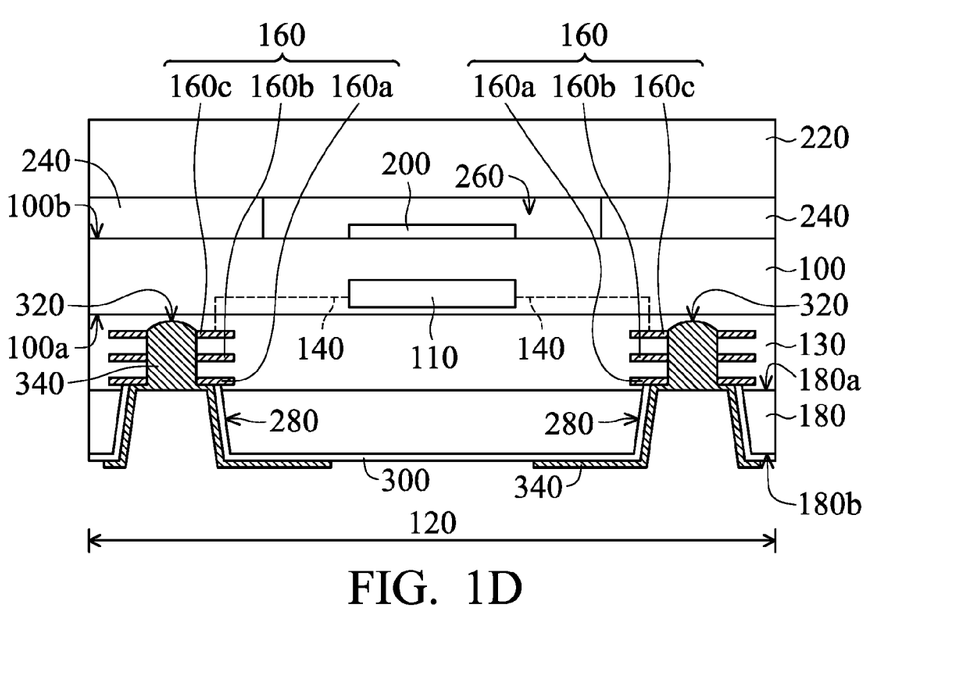
Figure 1E:
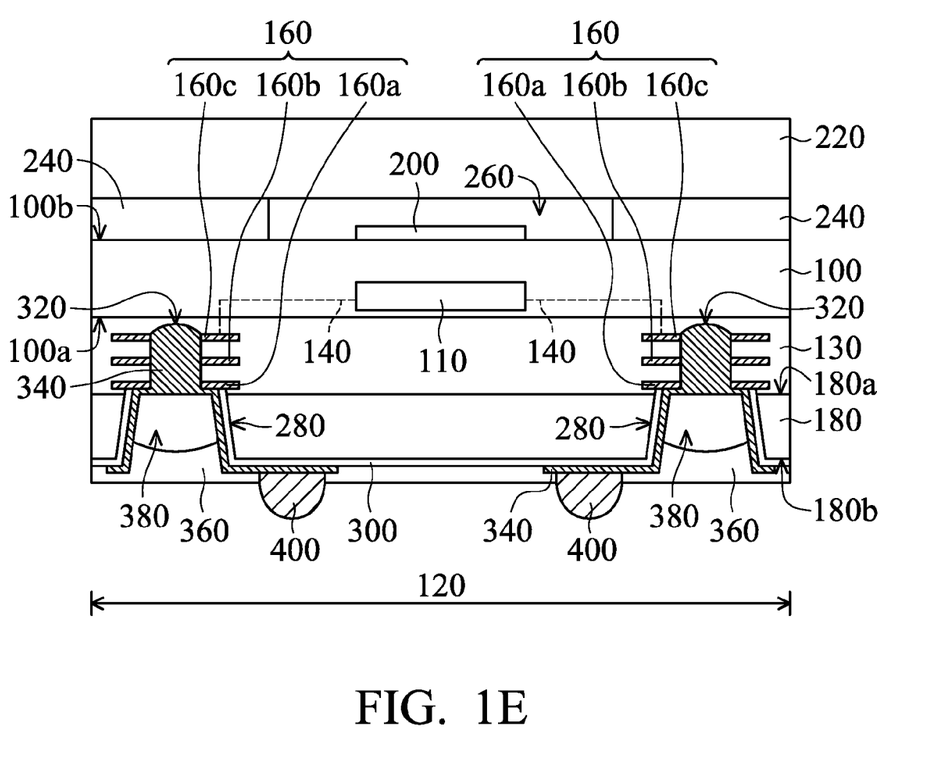

A cross-sectional view of an exemplary embodiment of a chip package according to the invention is illustrated in FIG. 1E. To illustrate embodiments of the present disclosure, a back side illumination (BSI) sensing device is depicted herein as an example. However, embodiments of the present disclosure are not limited to any particular application. In the embodiment, the chip package comprises a substrate 180, a dielectric layer 130, first openings 280, second openings 320, and a redistribution layer (RDL) 340. The substrate 180 has a first surface 180a and a second surface 180b opposite to the first surface 180a. In some embodiments, the substrate 180 may be a semiconductor substrate (such as a silicon substrate) or another suitable substrate.

The dielectric layer 130 is disposed on the first surface 180a of the substrate 180. The dielectric layer 130 comprises one or more conducting pad structures 160. In the embodiment, the dielectric layer 130 may be one or more layers of dielectric material (such as silicon dioxide, nitrides, oxides, nitrogen oxides or another suitable dielectric material). In some embodiments, the conducting pad structures 160 comprise a single conducting pad or comprise multiple vertically stacked conducting pads. In some embodiments, the conducting pad structures 160 comprise conductive material (such as copper, aluminum or an alloy thereof). To simplify the diagram, only three vertically stacked conducting pads 160a, 160b, and 160c and only two conducting pad structures 160 in the dielectric layer 130 are depicted herein as an example. The conducting pads 160a, 160b, and 160c can be electrically insulated from each other through the dielectric layer 130, and can be electrically connected to each other through conductive vias and/or contacts (not shown). In some embodiments, the conducting pads 160a, 160b, and 160c are sequentially vertically stacked along a direction from the second surface 180b towards the first surface 180a.

The first openings 280 extend from the second surface 180b of the substrate 180 towards the first surface 180a and penetrate the substrate 180. The first openings 280 extend further into the dielectric layer 130 so as to expose a surface of the conducting pad 160a of the conducting pad structures 160. In some embodiments, sidewalls of the first openings 280 are inclined to the first surface 180a of the substrate 180. In some other embodiments, the sidewalls of the first openings 280 may be substantially perpendicular to the first surface 180a of the substrate 180.

The second openings 320 extend from the surface of the conducting pad 160a of the conducting pad structures 160 (i.e., a bottom of the first openings 280) and penetrate all the conducting pads 160a, 160b and 160c of the conducting pad structures 160. As a result, the interior of the conducting pad structures 160 is exposed from the second openings 320. In some embodiments, sidewalls of the second openings 320 are substantially perpendicular to the first surface 180a of the substrate 180. In some other embodiments, the sidewalls of the second openings 320 may be inclined to the first surface 180a of the substrate 180. In the embodiment, the second openings 320 are in communication with the first openings 280. In some embodiments, a diameter of the second openings 320 is less than that of the first openings 280.

An insulating layer 300 is conformally disposed on the second surface 180b of the substrate 180, extends into the first openings 280, and exposes the surface of the conducting pad 160a of the conducting pad structures 160. In the embodiment, the insulating layer 300 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), a photoresist material or another suitable insulating material.

The patterned redistribution layer 340 is disposed on the insulating layer 300 and conformally extends to the sidewalls and the bottom of the first openings 280 (i.e., the redistribution layer 340 extends onto the surface of the conducting pad 160a of the conducting pad structures 160). The redistribution layer 340 further completely fills the second openings 320. The redistribution layer 340 is in direct electrical contact with or indirectly electrically connected to each exposed conducting pad 160a through the first openings 280. The redistribution layer 340 may be in direct electrical contact with or indirectly electrically connected to the interior of all the exposed conducting pads 160a, 160b and 160c through the second openings 320.

In addition, when the substrate 180 comprises a semiconductor material (such as silicon), the redistribution layer 340 in the first openings 280 is also referred to as a through silicon via (TSV). The redistribution layer 340 is electrically isolated from the semiconductor material by the insulating layer 300. In some embodiments, the redistribution layer 340 may comprise copper, aluminum, gold, platinum, nickel, tin, a combination thereof, a conductive polymer material, a conductive ceramic material (such as indium tin oxide or indium zinc oxide), or another suitable conductive material.

A passivation layer 360 is disposed on the insulating layer 300, covers the redistribution layer 340, and fills into the first openings 280. In some embodiments, there is a cavity 380 between the passivation layer 360 and the redistribution layer 340 in the first openings 280 and at the bottom of the first openings 280. In some other embodiments, the passivation layer 360 may completely fill the first openings 280. The passivation layer 360 has one or more openings exposing portions of the redistribution layer 340 on the second surface 180b. In the embodiment, the passivation layer 360 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material.

One or more conducting structures 400 are disposed in the openings of the passivation layer 360 to electrically connect to the exposed redistribution layer 340. In some embodiments, the conducting structures 400 may be a bump (such as a bonding ball or a conducting pillar) or another suitable conducting structure, and may comprise tin, lead, copper, gold, nickel, a combination thereof or another suitable conductive material.

In the embodiment, the chip package further comprises another substrate 100 disposed on the dielectric layer 130. The substrate 100 has a first surface 100a (which can be referred to as the front side) and a second surface 100b (which can be referred to as the back side) opposite thereto. In the embodiment, the dielectric layer 130 is located between the first surface 100a of the substrate 100 and the first surface 180a of the substrate 180. In other words, the first surface 100a of the substrate 100 is adjacent to the conducting pad 160c of the conducting pad structures 160 (which can be referred to as the bottommost conducting pad). The first surface 180a of the substrate 180 is adjacent to the conducting pad 160a of the conducting pad structures 160 (which can be referred to as the topmost conducting pad). In some embodiments, the substrate 100 may be a semiconductor substrate (such as a silicon substrate).

In some embodiments, the substrate 100 is a device substrate and comprises a device region 110. The device region 110 may comprise an image sensing element (such as photodiode, phototransistor, or another optical sensor). Furthermore, the substrate 100 may comprise integrated circuits for controlling the image sensing element and that are electrically connected to the conducting pad structures 160 in the dielectric layer 130. For example, the substrate 100 may comprise complementary metal oxide semiconductor (CMOS) transistors, resistor, capacitor, or another semiconductor element. To simplify the diagram, only a flat device region 110 is depicted herein, and dotted lines 140 are used herein to show electrical connection between the device region 110 and the conducting pad structures 160.

An optical element 200 (such as a microlens array, a filter layer, or another suitable optical element) may be optionally disposed on the second surface 100b (i.e., the back side) of the substrate 100. To simplify the diagram, only a flat optical element 200 is depicted herein. A cover plate 220 is disposed on the second surface 100b of the substrate 100 to protect the optical element 200. In the embodiment, the cover plate 220 may comprise glass or another suitable transparent material.

Furthermore, there may be a spacer layer (or dam) 240 between the substrate 100 and the cover plate 220. The spacer layer 240 surrounds the optical element 200, and a cavity 260 may be formed between the substrate 100 and the cover plate 220. In some embodiments, the spacer layer 240 does not substantially absorb moisture. In some embodiments, the spacer layer 240 may be non-adhesive, and the cover plate 220 is attached on the substrate 100 through the spacer layer 240 and an additional adhesive layer. In some other embodiments, the spacer layer 240 may itself be adhesive and may contact none of adhesion glue, thereby assuring that the spacer layer 240 will not move due to the disposition of the adhesion glue. Furthermore, since the adhesion glue is not needed, the optical element 200 can be prevented from being contaminated by an overflow of the adhesion glue. In some embodiments, the spacer layer 240 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material.

Figure 2:
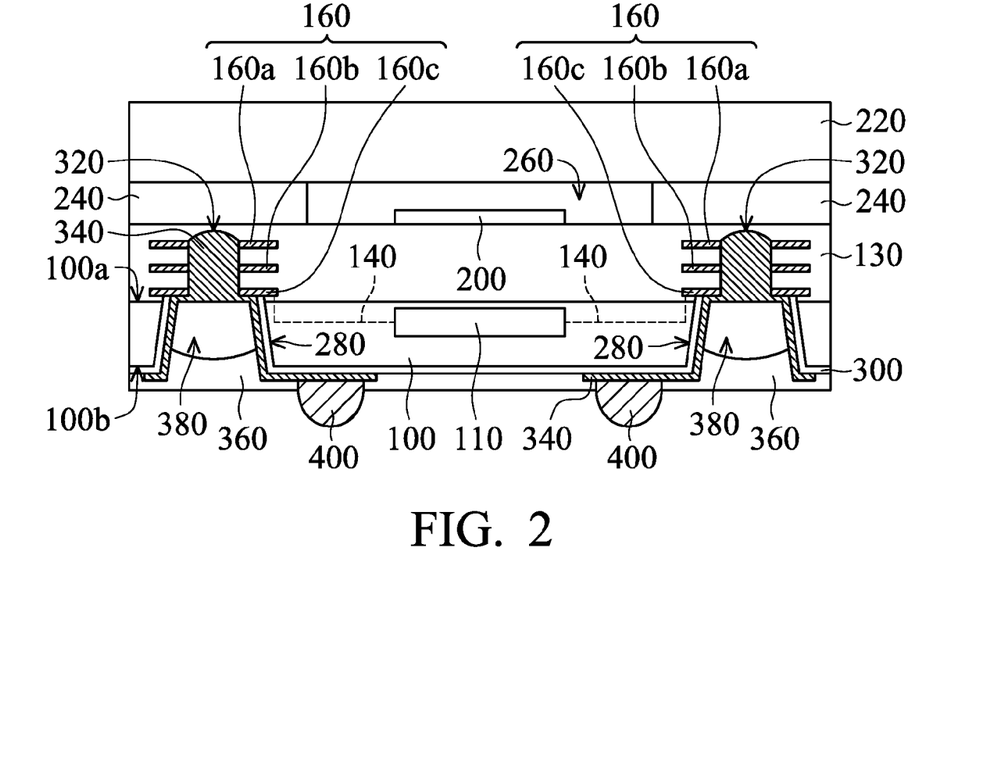
FIGS. 2 and 3 are cross-sectional views of various exemplary embodiments of a chip package according to the invention.
Figure 3:
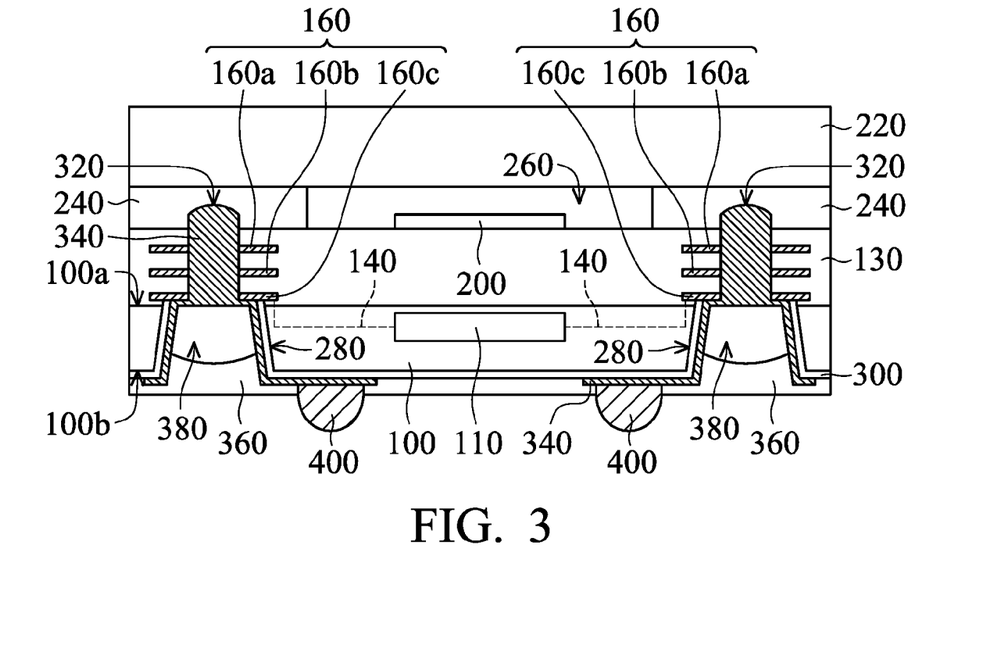

Cross-sectional views of various exemplary embodiments of a chip package according to the invention are illustrated in FIGS. 2 and 3, wherein elements in FIGS. 2 and 3 that are the same as those in FIG. 1E are labeled with the same reference numbers as in FIG. 1E and are not described again for brevity. To illustrate some other embodiments of the present disclosure, a front side illumination (FSI) sensing device is depicted herein as an example.

In some embodiments, the chip package comprises a substrate 100, a dielectric layer 130, first openings 280, second openings 320, and a redistribution layer 340, as shown in FIG. 2. The substrate 100 has a first surface 100a (which can be referred to as the front side) and a second surface 100b (which can be referred to as the back side) opposite thereto. In the embodiment, the substrate 100 is a device substrate, and has a device region 110 comprising an image sensing element.

The dielectric layer 130 is disposed on the first surface 100a of the substrate 100. The dielectric layer 130 comprises one or more conducting pad structures 160. In some embodiments, the conducting pad structures 160 comprise multiple vertically stacked conducting pads 160a, 160b, and 160c that are electrically connected to the device region 110 (as shown by dotted lines 140). The conducting pad 160a may be referred to as the topmost conducting pad, and the conducting pad 160c may be referred to as the bottommost conducting pad.

An optical element 200 (such as a microlens array, a filter layer, or another suitable optical element) may be optionally disposed on the dielectric layer 130 and the first surface 100a of the substrate 100 (i.e., the front side). A cover plate 220 is disposed on the dielectric layer 130 to protect the optical element 200. In the embodiment, the dielectric layer 130 is located between the cover plate 220 and the substrate 100. Furthermore, there may be a spacer layer (or dam) 240 between the dielectric layer 130 and the cover plate 220. The spacer layer 240 surrounds the optical element 200, and a cavity 260 may be formed between the dielectric layer 130 and the cover plate 220.

The first openings 280 extend from the second surface 100b of the substrate 100 towards the first surface 100a and penetrate the substrate 100. The first openings 280 extend further into the dielectric layer 130 so as to expose a surface of the bottommost conducting pad 160c of the conducting pad structures 160. The second openings 320 extend from the surface of the bottommost conducting pad 160c (i.e., a bottom of the first openings 280) towards the cover plate 220. The second openings 320 penetrate all the conducting pads 160a, 160b and 160c of the conducting pad structures 160. As a result, the interior of the conducting pad structures 160 is exposed from the second openings 320. In the embodiment, the second openings 320 are in communication with the first openings 280. In some embodiments, a diameter of the second openings 320 is less than that of the first openings 280.

An insulating layer 300 is conformally disposed on the second surface 100b of the substrate 100, extends into the first openings 280, and exposes the surface of the conducting pad 160c. The patterned redistribution layer 340 is disposed on the insulating layer 300 and conformally extends to the sidewalls and the bottom of the first openings 280 (i.e., the redistribution layer 340 extends onto the surface of the conducting pad 160c). The redistribution layer 340 further completely fills the second openings 320. The redistribution layer 340 is in direct electrical contact with or indirectly electrically connected to each exposed conducting pad 160c through the first openings 280. The redistribution layer 340 may be in direct electrical contact with or indirectly electrically connected to the interior of all the exposed conducting pads 160a, 160b and 160c through the second openings 320. In some embodiments, the redistribution layer 340 in the first openings 280 is also referred to as a TSV.

A passivation layer 360 is disposed on the insulating layer 300, covers the redistribution layer 340, and fills into the first openings 280. In some embodiments, the passivation layer 360 may completely or partially fill the first openings 280. The passivation layer 360 has one or more openings exposing portions of the redistribution layer 340 on the second surface 180b. One or more conducting structures 400 are disposed in the openings of the passivation layer 360 to electrically connect to the exposed redistribution layer 340.

The chip package structure shown in FIG. 3 is similar to that shown in FIG. 2. The difference therebetween is that the second openings 320 shown in FIG. 3 extend towards the cover plate 220, penetrates the conducting pad structures 160 and the dielectric layer 130, and extend further into the spacer layer 240.

According to the aforementioned embodiments, the chip package comprises the second openings extending from the surface of the topmost or bottommost conducting pad (i.e., the bottom of the first openings). The second openings penetrate all the conducting pads and expose the interior of all the conducting pads. As a result, the redistribution layer is in direct electrical contact with not only the surface of the topmost or bottommost conducting pad but also the interior of all the conducting pads. Therefore, the contact area between the redistribution layer and the conducting pad structure is increased, thereby improving the conductance between the redistribution layer and the conducting pad structure.

Furthermore, the redistribution layer penetrates all the conducting pads through the second openings and embeds itself deeply in the interior of all the conducting pads. As a result, the structural strength between the redistribution layer and the conducting pad structure is enhanced. Therefore, the reliability and quality of the chip packages is improved.

An exemplary embodiment of a method for forming a chip package according to the invention is illustrated in FIGS. 1A to 1E, in which FIGS. 1A to 1E are cross-sectional views of an exemplary embodiment of a method for forming a chip package according to the invention. To illustrate embodiments of the present disclosure, a BSI sensing device is depicted herein as an example. However, embodiments of the present disclosure are not limited to any particular application.

Referring to FIG. 1A, a substrate 100, a substrate 180, and a dielectric layer 130 between the substrate 100 and the substrate 180 are provided. The substrate 100 has a first surface 100a (which can be referred to as the front side) and a second surface 100b (which can be referred to as the back side) opposite thereto. The substrate 100 comprises multiple chip regions. To simplify the diagram, only one chip region 120 of the substrate 100 is depicted herein. In some embodiments, the substrate 100 may be a silicon substrate or another semiconductor substrate. For example, the substrate 100 may be a silicon wafer so as to facilitate the wafer-level packaging process.

In some embodiments, the substrate 100 is a device substrate and the substrate 100 in each chip region 120 comprises a device region 110. The device region 110 may comprise an image sensing element (such as photodiode, phototransistor, or another optical sensor). Furthermore, the substrate 100 may comprise integrated circuits for controlling the image sensing element. For example, the substrate 100 may comprise CMOS transistors, resistor, capacitor, or another semiconductor element. To simplify the diagram, only a flat device region 110 is depicted herein.

The substrate 180 has a first surface 180a and a second surface 180b opposite to the first surface 180a. In some embodiments, the substrate 180 may be a semiconductor substrate (such as a silicon substrate) or another suitable substrate.

The dielectric layer 130 is located between the first surface 100a of the substrate 100 and the first surface 180a of the substrate 180. In the embodiment, the dielectric layer 130 may be one or more layers of dielectric material (such as silicon dioxide, nitrides, oxides, nitrogen oxides or another suitable dielectric material). The dielectric layer 130 in each chip region 120 comprises one or more conducting pad structures 160 electrically connected to the integrated circuits in the substrate 100 and the device region 110.

In some embodiments, the conducting pad structures 160 comprise a single conducting pad or comprise multiple vertically stacked conducting pads. In some embodiments, the conducting pad structures 160 comprise conductive material (such as copper, aluminum or an alloy thereof). To simplify the diagram, only three vertically stacked conducting pads 160a, 160b, and 160c and only two conducting pad structures 160 in single chip region 120 of the substrate 100 are depicted herein as an example. Dotted lines 140 are used herein to show electrical connection between the device region 110 and the conducting pad structures 160.

The conducting pads 160a, 160b, and 160c can be electrically insulated from each other through the dielectric layer 130, and can be electrically connected to each other through conductive vias and/or contacts (not shown). In some embodiments, the conducting pads 160a, 160b, and 160c are sequentially vertically stacked along a direction from the substrate 180 towards the substrate 100. Therefore, the first surface 100a of the substrate 100 is adjacent to the conducting pad 160c of the conducting pad structures 160 (which can be referred to as the bottommost conducting pad). The first surface 180a of the substrate 180 is adjacent to the conducting pad 160a of the conducting pad structures 160 (which can be referred to as the topmost conducting pad).

In some embodiments, an optical element 200 (such as a microlens array, a filter layer, or another suitable optical element) may be optionally disposed on the second surface 100b (i.e., the back side) of the substrate 100 in each chip region 120. To simplify the diagram, only a flat optical element 200 is depicted herein. Afterwards, the substrate 180 is used as a support, and a cover plate 220 is attached on the second surface 100b of the substrate 100 to protect the optical element 200. In the embodiment, the cover plate 220 may comprise glass or another suitable transparent material.

In some embodiments, there is a spacer layer (or dam) 240 between the substrate 100 and the cover plate 220. The spacer layer 240 surrounds the optical element 200, and a cavity 260 is formed between the substrate 100 and the cover plate 220. In some embodiments, the spacer layer 240 does not substantially absorb moisture. In some embodiments, the spacer layer 240 may be non-adhesive, and the cover plate 220 is attached on the substrate 100 through the spacer layer 240 and an additional adhesive layer. In some other embodiments, the spacer layer 240 may itself be adhesive and may contact none of adhesion glue, thereby assuring that the spacer layer 240 will not move due to the disposition of the adhesion glue. Furthermore, since the adhesion glue is not needed, the optical element 200 can be prevented from being contaminated by an overflow of the adhesion glue. In some embodiments, the spacer layer 240 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material.

Referring to FIG. 1B, one or more first openings 280 may be formed in the first substrate 100 in each chip region 120 by lithography and etching processes (the etching process may comprise a dry etching process, a wet etching process, a plasma etching process, a reactive ion etching process, or another suitable process). The first openings 280 extend from the second surface 180b of the substrate 180 towards the first surface 180a and penetrate the substrate 180. The first openings 280 extend further into the dielectric layer 130 so as to expose a surface of the topmost conducting pad 160a of the conducting pad structures 160. In addition, a thinning process (such as an etching process, a milling process, a mechanical grinding process or a chemical mechanical polishing process) may be performed on the second surface 180b of the substrate 180 before the formation of the first openings 280. As a result, the thickness of the substrate 180 is reduced.

Next, an insulating layer 300 may be conformally formed on the second surface 180b of the substrate 180 by a deposition process (such as a coating process, a physical vapor deposition process, a chemical vapor deposition process or another suitable process). The insulating layer 300 extends to the sidewalls and the bottom of the first openings 280. In the embodiment, the insulating layer 300 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Referring to FIG. 1C, portions of the insulating layer 300 on the bottom of the first openings 280 are removed by lithography and etching processes (the etching process may comprise a dry etching process, a wet etching process, a plasma etching process, a reactive ion etching process, or another suitable process). As a result, the surface of the conducting pads 160a is exposed.

Afterwards, one or more second openings 320 may be formed in each chip region 120 by a laser drilling process or another suitable process. The second openings 320 extend from the surface of the topmost conducting pad 160a (i.e., the bottom of the first openings 280) and penetrate all the conducting pads 160a, 160b and 160c of the conducting pad structures 160. As a result, the interior of the conducting pad structures 160 is exposed from the second openings 320. In the embodiment, the second openings 320 are in communication with the first openings 280. In some embodiments, a diameter of the second openings 320 is less than that of the first openings 280.

Referring to FIG. 1D, a patterned redistribution layer 340 is formed on the insulating layer 300 by a deposition process (such as a coating process, a chemical vapor deposition process, a physical vapor deposition process, an electroplating process, an electroless plating process or another suitable process) and lithography and etching processes.

The redistribution layer 340 conformally extends to the sidewalls and the bottom of the first openings 280 (i.e., the redistribution layer 340 extends onto the exposed surface of the conducting pad 160a). The redistribution layer 340 further completely fills the second openings 320. The redistribution layer 340 is in direct electrical contact with or indirectly electrically connected to each exposed conducting pad 160a through the first openings 280. The redistribution layer 340 is in direct electrical contact with or indirectly electrically connected to the interior of all the exposed conducting pads 160a, 160b and 160c through the second openings 320.

In addition, when the substrate 180 comprises a semiconductor material (such as silicon), the redistribution layer 340 in the first openings 280 is also referred to as a TSV. The redistribution layer 340 is electrically isolated from the semiconductor material by the insulating layer 300. In some embodiments, the redistribution layer 340 may comprise copper, aluminum, gold, platinum, nickel, tin, a combination thereof, a conductive polymer material, a conductive ceramic material (such as indium tin oxide or indium zinc oxide), or another suitable conductive material.

In these embodiments, the redistribution layer embeds itself deeply in the interior of all the conducting pads through the second openings. As a result, the junction strength between the redistribution layer and the conducting pad structure is further enhanced. Also, peeling issues between the redistribution layer and the conducting pad structure can be avoided. Therefore, the reliability and quality of the chip packages is improved.

Referring to FIG. 1E, a passivation layer 360 may be formed on the insulating layer 300 by a deposition process (such as a coating process, a physical vapor deposition process, a chemical vapor deposition process or another suitable process). The passivation layer 360 covers the redistribution layer 340 and fills into the first openings 280. In some embodiments, a cavity 380 is built between the passivation layer 360 and the redistribution layer 340 in the first openings 280. Accordingly, the redistribution layer 340 can be prevented from being negatively affected by the excess stress accumulated in the passivation layer 360. In some other embodiments, the passivation layer 360 completely fills the first openings 280.

Afterwards, one or more openings may be formed in the passivation layer 360 in each chip region 120 by lithography and etching processes so as to expose portions of the redistribution layer 340 on the second surface 180b. In some embodiments, the passivation layer 360 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material. In some other embodiments, the passivation layer 360 may comprise a photoresist material, and the openings may be formed in the passivation layer 360 by a lithography process.

Next, one or more conducting structures 400 are formed in the openings of the passivation layer 360 and are electrically connected to the exposed portions of the redistribution layer 340. For example, solder may be formed in the openings of the passivation layer 360 by a plating process, a screen printing process or another suitable process. A reflow process is then performed and one or more solder balls are formed to be the conducting structures 400. In some embodiments, the conducting structures 400 may be a bump (such as a bonding ball or a conducting pillar) or another suitable conducting structure, and may comprise tin, lead, copper, gold, nickel, a combination thereof or another suitable conductive material.

Subsequently, a dicing process is performed along scribe-lines (not shown) between the adjacent chip regions 120. The cover plate 220, the substrate 100, the dielectric layer 130, and the substrate 180 are diced so as to form a plurality of independent chip packages.

It should be realized that the aforementioned embodiments of a method for forming a chip package are not limited to a BSI sensing device. They can also be implemented to a FSI sensing device (as shown in FIGS. 2 and 3) and other sensing devices. For example, the formation of the second openings can be implemented to chip packages comprising a sensing device which is configured to sense biometrics (such as a fingerprint-recognition device) or comprising a sensing device which is configured to sense environmental characteristics (such as a temperature-sensing device, a humidity-sensing device, a pressure-sensing device or a capacitance-sensing device).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface and a second surface opposite thereto;
   a dielectric layer disposed on the first surface of the substrate, wherein the dielectric layer comprises a conducting pad structure;
   a first opening penetrating the substrate and exposing a surface of the conducting pad structure;
   a second opening in communication with the first opening and penetrating the conducting pad structure; and
   a redistribution layer conformally disposed on a sidewall of the first opening and the surface of the conducting pad structure and filling into the second opening, wherein the redistribution layer completely fills the second opening and does not completely fill the first opening.

2. The chip package as claimed in claim 1, wherein a diameter of the second opening is less than that of the first opening.

3. The chip package as claimed in claim 1, wherein the conducting pad structure comprises a plurality of vertically stacked conducting pads, and wherein the first opening exposes a surface of one of the plurality of conducting pads, and the second opening extends from the surface of one of the plurality of conducting pads and penetrates the plurality of conducting pads.

4. The chip package as claimed in claim 1, further comprising a passivation layer disposed on the redistribution layer in the first opening.

5. The chip package as claimed in claim 4, wherein a cavity is between the passivation layer and the redistribution layer.

6. The chip package as claimed in claim 1, further comprising:
   a cover plate, wherein the dielectric layer is between the cover plate and the substrate; and
   a spacer layer disposed between the cover plate and the dielectric layer.

7. The chip package as claimed in claim 6, wherein the second opening extends further into the spacer layer.

8. The chip package as claimed in claim 1, further comprising another substrate, wherein the another substrate comprises a device region electrically connected to the conducting pad structure, and wherein the dielectric layer is between the another substrate and the substrate.

9. The chip package as claimed in claim 1, wherein the substrate comprises a device region electrically connected to the conducting pad structure.

10. A method for forming a chip package, comprising:
    providing a substrate having a first surface and a second surface opposite thereto, wherein a dielectric layer is disposed on the first surface of the substrate, and wherein the dielectric layer comprises a conducting pad structure;
    forming a first opening penetrating the substrate and exposing a surface of the conducting pad structure;
    forming a second opening in communication with the first opening and penetrating the conducting pad structure; and
    forming a redistribution layer conformally on a sidewall of the first opening and the surface of the conducting pad structure and filling into the second opening, wherein the redistribution layer completely fills the second opening and does not completely fill the first opening.

11. The method as claimed in claim 10, wherein a diameter of the second opening is less than that of the first opening.

12. The method as claimed in claim 10, wherein the conducting pad structure comprises a plurality of vertically stacked conducting pads, and wherein the first opening exposes a surface of one of the plurality of conducting pads, and the second opening extends from the surface of one of the plurality of conducting pads and penetrates the plurality of conducting pads.

13. The method as claimed in claim 10, further comprising forming a passivation layer on the redistribution layer in the first opening.

14. The method as claimed in claim 13, wherein a cavity is formed between the passivation layer and the redistribution layer in the first opening.

15. The method as claimed in claim 10, further comprising providing a cover plate and a spacer layer, wherein the dielectric layer is between the cover plate and the substrate, and wherein the spacer layer is between the cover plate and the dielectric layer.

16. The method as claimed in claim 15, wherein the second opening extends further into the spacer layer.

17. The method as claimed in claim 10, further comprising providing another substrate, wherein the another substrate comprises a device region electrically connected to the conducting pad structure, and wherein the dielectric layer is between the another substrate and the substrate.

18. The method as claimed in claim 10, wherein the substrate comprises a device region electrically connected to the conducting pad structure.

19. The method as claimed in claim 10, wherein the substrate is a wafer.

20. The method as claimed in claim 19, further comprising dicing the wafer to form a plurality of chip packages after forming the redistribution layer.

* * * * *